United States Patent
Nozawa et al.

(10) Patent No.: US 8,366,869 B2
(45) Date of Patent: Feb. 5, 2013

(54) PROCESSING APPARATUS AND PROCESSING METHOD

(75) Inventors: Toshihisa Nozawa, Amagasaki (JP); Koji Kotani, Amagasaki (JP); Kouji Tanaka, Amagasaki (JP)

(73) Assignee: Tokyo Electron Limited, Tokyo (JP)

(*) Notice: Subject to any disclaimer, the term of this patent is extended or adjusted under 35 U.S.C. 154(b) by 1025 days.

(21) Appl. No.: 12/226,089

(22) PCT Filed: Apr. 6, 2007

(86) PCT No.: PCT/JP2007/057768
§ 371 (c)(1),
(2), (4) Date: Oct. 6, 2008

(87) PCT Pub. No.: WO2007/116969
PCT Pub. Date: Oct. 18, 2007

(65) Prior Publication Data
US 2009/0053900 A1 Feb. 26, 2009

(30) Foreign Application Priority Data
Apr. 7, 2006 (JP) ................................. 2006-106107

(51) Int. Cl.
C23F 1/00 (2006.01)
H01L 21/306 (2006.01)
C23C 16/455 (2006.01)
C23C 16/52 (2006.01)
C23C 16/06 (2006.01)
C23C 16/22 (2006.01)

(52) U.S. Cl. .................. 156/345.26; 118/695; 118/698; 118/704; 118/696; 156/345.24

(58) Field of Classification Search ............. 156/345.26, 156/345.24; 118/695, 698, 704, 696
See application file for complete search history.

(56) References Cited

U.S. PATENT DOCUMENTS
5,070,813 A * 12/1991 Sakai et al. ............... 118/695
(Continued)

FOREIGN PATENT DOCUMENTS
EP 0 382 985 A1 8/1990
JP 09-181052 A 7/1997
(Continued)

OTHER PUBLICATIONS
Office Action of Korea application No. 10-2008-7005619, mailed on Jan. 20, 2010, Total 3 pages.
(Continued)

Primary Examiner — Rudy Zervigon
(74) Attorney, Agent, or Firm — Pearne & Gordon LLP

(57) ABSTRACT

A processing apparatus includes a process container having a placing table for placing a processing object, an exhaust system having vacuum pumps and a pressure control valve for exhausting atmosphere in the process container. A gas injection unit having a gas ejection hole is provided in the process container, as well as a gas supplying unit for supplying a process gas to the gas injection unit. The entire process apparatus is controlled by a controlling unit. The control unit controls the exhaust system and the gas supplying unit. When starting a predetermined process, the process gas at a flow rate greater than a prescribed flow rate is supplied for a short time while exhausting the atmosphere in the process container by the exhaust system, and then the process gas at a prescribed flow rate is supplied.

11 Claims, 6 Drawing Sheets

U.S. PATENT DOCUMENTS

| | | | |
|---|---|---|---|
| 5,180,436 A * | 1/1993 | Ueda et al. | 118/723 MR |
| 5,211,825 A * | 5/1993 | Saito et al. | 204/192.32 |
| 5,282,925 A * | 2/1994 | Jeng et al. | 216/59 |
| 5,368,685 A * | 11/1994 | Kumihashi et al. | 216/70 |
| 5,415,718 A * | 5/1995 | Ohmi et al. | 156/345.26 |
| 5,444,259 A * | 8/1995 | Ohmi | 250/492.21 |
| 5,474,650 A * | 12/1995 | Kumihashi et al. | 216/67 |
| 5,500,256 A * | 3/1996 | Watabe | 427/579 |
| 5,565,038 A * | 10/1996 | Ashley | 134/2 |
| 5,575,853 A * | 11/1996 | Arami et al. | 118/708 |
| 5,851,842 A * | 12/1998 | Katsumata et al. | 438/9 |
| 6,782,348 B2 * | 8/2004 | Ushiku | 702/183 |
| 6,782,907 B2 * | 8/2004 | Kawasaki et al. | 137/12 |
| 6,919,270 B2 * | 7/2005 | Satoh et al. | 438/652 |
| 7,422,636 B2 * | 9/2008 | Ishizaka | 118/719 |
| 7,666,479 B2 * | 2/2010 | Strang | 427/569 |
| 8,235,001 B2 * | 8/2012 | Sano et al. | 118/696 |
| 2002/0192369 A1 * | 12/2002 | Morimoto et al. | 427/248.1 |
| 2003/0000924 A1 * | 1/2003 | Strang | 216/86 |
| 2003/0094136 A1 * | 5/2003 | Bartholomew et al. | 118/715 |
| 2004/0081607 A1 | 4/2004 | Hasegawa | |
| 2004/0261711 A1 * | 12/2004 | Choi et al. | 118/723 E |
| 2005/0145333 A1 * | 7/2005 | Kannan et al. | 156/345.24 |
| 2005/0160983 A1 * | 7/2005 | Sneh | 118/715 |
| 2005/0205013 A1 * | 9/2005 | Nakanishi et al. | 118/723 AN |
| 2007/0221130 A1 | 9/2007 | Nozawa et al. | |
| 2008/0213479 A1 * | 9/2008 | Chou et al. | 427/255.393 |
| 2008/0264337 A1 * | 10/2008 | Sano et al. | 118/704 |
| 2008/0311760 A1 * | 12/2008 | Nodera et al. | 438/791 |
| 2009/0053835 A1 * | 2/2009 | Moriya et al. | 438/8 |
| 2009/0130829 A1 * | 5/2009 | Noda et al. | 438/503 |
| 2009/0152242 A1 * | 6/2009 | Sato et al. | 216/67 |
| 2009/0178694 A1 * | 7/2009 | Okuda et al. | 134/22.12 |
| 2009/0191722 A1 * | 7/2009 | Hasebe et al. | 438/792 |
| 2009/0263975 A1 * | 10/2009 | Kadonaga et al. | 438/763 |
| 2010/0136260 A1 * | 6/2010 | Matsunaga et al. | 427/569 |
| 2010/0163181 A1 * | 7/2010 | Kobayashi et al. | 156/345.24 |
| 2010/0192855 A1 * | 8/2010 | Yuasa et al. | 118/696 |
| 2011/0021033 A1 * | 1/2011 | Ikeuchi et al. | 438/758 |

FOREIGN PATENT DOCUMENTS

| | | |
|---|---|---|
| JP | 11-054491 A | 2/1999 |
| JP | 2002-311892 A | 10/2002 |
| JP | 2003-168680 | 6/2003 |
| JP | 2003-168680 A | 6/2003 |
| JP | 05-166733 A | 7/2003 |
| WO | WO 2005/117083 A1 | 12/2005 |

OTHER PUBLICATIONS

The extended European search report in European Patent Application No. 07741204.7, issued on Apr. 20, 2010, of European Patent Office.

Contents of Notice of Reason for Rejection in Japanese Patent Application No. 2006-106107, issued on Dec. 6, 2011, Japan Patent Office.

* cited by examiner

PROCESSING APPARATUS AND PROCESSING METHOD

TECHNICAL FIELD

The present invention relates to a processing apparatus and processing method used to apply a plasma process, a film forming process or an etching process to a processing object, such as a semiconductor wafer. And specifically relates to a processing apparatus and processing method for rapidly performing a supply of a gas at the beginning of a process or a switching of gas types.

BACKGROUND OF THE INVENTION

Generally, in order to manufacture semiconductor products, such as a semiconductor integrated circuit and so on, various processes, such as film forming processes, etching processes, oxidative diffusion processes, ashing processes, and modification processes, are repeatedly performed to, for example, a semiconductor wafer. From the standpoint of improving product yield, along with the high density growth and high miniaturization of semiconductor products, such various processes are required to further increase the evenness of the surface of the wafer to be processed, as well as to improve throughput in order to increase manufacturing efficiency.

Here, a single wafer process type plasma processing apparatus is explained as an example of a conventional processing apparatus. The plasma processing apparatus of this type is disclosed in, for example, patent documents 1 and 2 (listed below). FIG. 6 is an outline configuration diagram illustrating a conventional common plasma processing apparatus.

In FIG. 6, this plasma processing apparatus 2 has a process container 4 capable of vacuuming and a placing table 6 provided in the process container 4 for placing a semiconductor wafer W. And this placing table 6 is supported by a supporting arm 7 in a L-shape extending from the side wall of the container. On a ceiling section facing the placing table 6, a top plate 8, which transmits microwaves and is formed from aluminum nitride or quartz in a disk shape, is hermetically provided. And on the side wall of the process container 4, a gas nozzle 9 is provided to introduce a predetermined gas into the container.

And, on the surface of the top plate 8, provided are a disc-shaped planar antenna member 10 in a thickness of a few millimeters and a slow wave structure 12 consisting of, for example, a dielectric body, for shortening the wavelength of a microwave in the radius direction of the planar antenna member 10. Further, a plurality of microwave ejection holes 14 consisting of, for example slot-shaped through holes are formed. These microwave ejection holes 14 are generally arranged concentrically or spirally. And, a center conductor 18 of the coaxial wave guide 16 is connected on the center of the planar antenna member 10 and a microwave of 2.45 GHz, for example, generated from a microwave generator 20 is converted into a predetermined oscillation mode, and then guided through the center conductor 18. While the microwave is propagated to the radius direction of the antenna member 10 radially, the microwave is ejected from the microwave ejection holes 14 provided on the planar antenna member 10 and transmitted though the top plate 8. Next, the microwave is introduced into the process container 4 on the lower side, and a plasma is generated in the process space S in the process container 4 by this microwave.

Further, an exhaust opening 24 is provided on the bottom section 4A of the process container and an exhaust channel 32 in which a pressure control valve 26, first and second vacuum pumps 28 and 30 are inserted, is connected to this exhaust opening 24, thereby atmosphere in the process container 4 can be vacuumed. In such a configuration, a plasma is formed in the process space S in the process container 4 and the plasma process, such as plasma etching or plasma film forming, is applied to the semiconductor wafer W above.

By the way, when a predetermined process treatment is performed on a wafer, generally a predetermined gas is introduced into the process container 4 and the pressure in the process container 4 is controlled by the pressure control valve 26 as a preparation of performing this process treatment. When the pressure in the process container 4 is stabilized to the prescribed pressure, a predetermined process is performed by turning the plasma on.

Depending on the type of the process to the wafer, there is a case where a process is performed continuously by switching the gas types supplied to a single wafer. Such a process may be referred to as a so called multi-step process. In a case when performing such a multi-step process, the supply of a process gas is stopped when one process step is completed. Next, the residual gas in the process container 4 is exhausted once, and next, a procedure to stabilize the pressure is performed again by supplying a process gas for the next process. Thereafter, the step process is performed.

Patent document 1: Unexamined Japanese Patent Application Publication No. H9-181052.
Patent document 2: Unexamined Japanese Patent Application Publication No. 2002-311892.

By the way, in the process method described above, it certainly requires about 10 seconds to stabilize the pressure in the process container 4 due to the compressibility of the gas when performing the procedure of process treatment using the pressure control valve 26 (stabilization of the pressure), during which the process can not be executed, thereby resulting in a decrease of throughput.

Especially in a case of a multi-step process, because the exhaust process of the residual gas for a precedent process and the pressure stabilization process of the process gas for a subsequent process must be performed each time the gas type is switched, the throughput is significantly decreased.

SUMMARY OF THE INVENTION

The present invention has been made considering the above issues to effectively resolve them. An objective of the present invention is to provide a processing apparatus and method capable of rapidly stabilizing the pressure in the process container at the beginning of a process, as well as rapidly exhausting residual gas and stabilizing the pressure in the process container at the switch of the gas type.

The present invention is a processing apparatus for performing a predetermined process to a processing object using a process gas of a prescribed flow rate, the processing apparatus including a process container having a placing table inside for placing the processing object, an exhaust system having a vacuum pump and a pressure control valve for exhausting atmosphere in the process container, a gas injection unit having a gas ejection hole for ejecting process gas into the process container, a gas supply unit for supplying the process gas to the gas injection unit while controlling the flow rate, and a controlling unit for controlling the entire processing apparatus, wherein the controlling unit controlling the exhaust system and the gas supplying unit to supply the process gas at a flow rate greater than a prescribed flow rate for the predetermined process for a predetermined short time while exhausting atmosphere in the process container at the time starting the predetermined process, and thereafter supplying the process gas of the prescribed flow rate from the gas channel.

In this way, the process gas of the prescribed flow rate is supplied after supplying the process gas at the flow rate greater than the prescribed flow rate for the predetermined process for a predetermined short time while exhausting the atmosphere in the process container at the time starting the predetermined process to the processing object contained in the process container, thereby, the pressure in the process container can be rapidly stabilized at the time of starting the process.

The present invention is a processing apparatus, wherein the control unit controls the exhaust system and the gas supply unit to supply the process gas at a flow rate greater than the prescribed flow rate for a predetermined short time which is determined based on the volume of the process container, the process pressure in the process container at the time of the predetermined process, and the time required to increase the pressure to the process pressure in the process container.

The present invention is a processing apparatus wherein the control unit controlling the exhaust system and the gas supply unit to supply the process gas at a flow rate greater than the prescribed flow rate within three seconds.

The present invention is a processing apparatus wherein the control unit controls the exhaust system and the gas supply unit to supply the process gas at the flow rate greater then the prescribed flow rate, at the same time, control the pressure control valve to configure a degree of the valve opening corresponding to the process pressure in the process container at the predetermined process.

The present invention is a processing apparatus wherein the gas supplying unit supplies a plurality of types of processing gases that are selectively supplied by switching.

The present invention is a processing apparatus wherein the gas supplying unit has a gas channel connected to the gas injection unit, and a bypass channel for a high rate exhaust, which has an on-off valve for the high-rate exhaust, which is provided between the gas channel and the process container.

The present invention is a processing apparatus wherein the gas supplying unit has a gas channel connected to the gas injection unit, and a bypass channel for high rate exhaust, which has an on-off valve for high-rate exhaust, which is provided between the gas channel and the exhaust system.

The present invention is a processing apparatus wherein the control unit opens the on-off valve for high-rate exhaust to exhaust the process gas from the precedent process that remains in the gas channel right before flowing the process gas at a flow rate greater than the prescribed flow rate for a predetermined short time.

According to above, the exhaust of the residual gas at the switch of gas type and the stabilization of the pressure in the process container can be performed quickly.

The present invention is a processing apparatus wherein the gas injection unit includes a shower head having a plurality of gas ejection holes.

The present invention is a processing apparatus characterized by having a heating unit for heating the processing object.

The present invention is a processing apparatus characterized by providing a plasma generating unit in the process container for generating plasma.

The present invention is a processing method for performing a predetermined process to a processing object by supplying a process gas of a prescribed flow rate in the process container capable of exhausting a gas, the method including a process for supplying the process gas at a flow rate greater than the prescribed flow rate for the predetermined process for a predetermined short time while exhausting atmosphere in the process container by the exhaust system at the time starting the predetermined process, and a process for supplying the process gas at the prescribed flow rate from the gas channel after supplying the process gas at the flow rate greater than the prescribed flow rate for only the predetermined short time.

The present invention is capable of selectively supplying a plurality of types of processing gases into the process container. The process method is characterized that in a case when supplying the processing gas into the process container by switching the processing gas, the processing gas from the precedent process remains in the gas channel for supplying the processing gas is exhausted into the process container or the exhaust system through a bypass channel for high-rate exhausting right before flowing the processing gas at a flow rate greater than the prescribed flow rate.

The present invention is a storage medium for memorizing a computer program controlling a processing apparatus including a process container having a placing table inside for placing a processing object, an exhaust system having a vacuum pump and a pressure control valve for exhausting atmosphere in the process container, a gas injection unit having a gas ejection hole for ejecting a process gas into the process container, and a gas supply unit for supplying the process gas to the gas injection unit while controlling the flow rate, wherein the computer program executes the processing method including the process for supplying the process gas at a flow rate greater than the prescribed flow rate for the predetermined process for a predetermined short time from the gas channel while exhausting the atmosphere in the process container by the exhaust system at the time starting the predetermined process, and a process for supplying the processing gas at the prescribed flow rate from the gas channel after supplying the processing gas at a flow rate greater than the prescribed flow rate for only the predetermined short time.

The present invention is a computer program for controlling a processing apparatus including a process container having a placing table inside for placing a processing object, an exhaust system having a vacuum pump and a pressure control valve for exhausting atmosphere in the process container, a gas injection unit having a gas ejection hole for ejecting a process gas into the process container, and a gas supply unit for supplying the process gas while controlling the flow rate to the gas injection unit, wherein the computer program executes the processing method including the process for supplying the processing gas at a flow rate greater than the prescribed flow rate for the predetermined process for a predetermined short time from the gas channel while exhausting the atmosphere in the process container by the exhaust system at the time starting the predetermined process, and a process for supplying the processing gas at prescribed flow rate from the gas channel after supplying the processing gas at a flow rate greater than the prescribed flow rate for only the predetermined short time.

According to the processing apparatus and processing method of the present invention, the following superior effects can be exerted.

The pressure in the process container can be rapidly stabilized at the time of starting the process because the processing gas is controlled to supply the prescribed flow rate after supplying the processing gas at a flow rate greater than the prescribed flow rate of the predetermined process for a predetermined short time while exhausting the atmosphere in the process container at the time starting the predetermined process to the processing object contained in the process container.

Also, according to the present invention, the exhaust of the residual gas at the time of switching the gas type and the stabilization of the pressure in the process container can be performed rapidly because the control unit opens the on-off valve for high-rate exhausting for only a short time to exhaust the processing gas from the precedent process remaining in the gas channel before flowing the processing gas at a large flow rate for a predetermined short time.

DETAILED DESCRIPTION OF THE INVENTION

An embodiment of a processing apparatus and processing method pertaining to the present invention is hereinafter explained with reference to the attached drawings.

Figure 1:
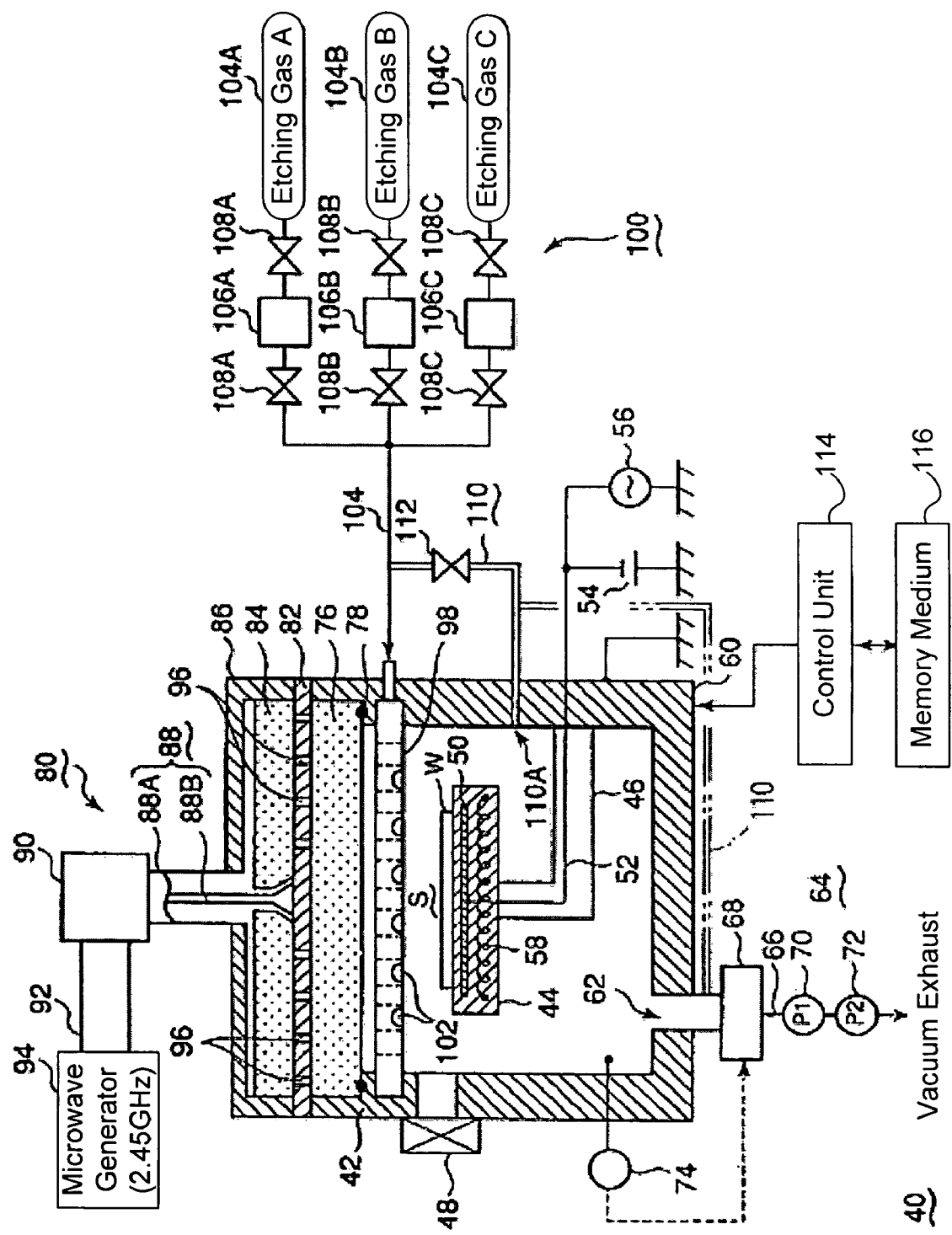
FIG. 1 is a configuration diagram illustrating an example of a processing apparatus pertaining to the present invention.

FIG. 1 is a configuration diagram illustrating an example of a processing apparatus pertaining to the present invention. Here, a plasma processing apparatus is explained as an example of the processing apparatus.

As shown in the figure, a plasma processing apparatus 40 as a processing apparatus, has, for example, a process container 42 formed in a tubular shape, in which a side wall and a bottom section are configured by a conductor, such as aluminum. And inside, the process container 42 is configured as a hermitical processing space, and a plasma is formed in the processing space of the process container 42. The process container 42 itself is grounded.

Inside the process container 42, provided is a disk shaped placing table 44 for placing, for example, a semiconductor wafer W as a processing object on an upper face. This placing table 44 is formed by a ceramic, such as alumina, in a virtual disk shape, and is supported from a container side wall through a supporting arm 46 consisting of, for example, aluminum, bended in a L-shape.

On an upper face side of this placing table 44, a thin electrostatic chuck 50 having a conductor wire, which is arranged in, for example, a reticulate inside, and a wafer W that is located on this placing table 44, specifically on the electrostatic chuck 50 can be absorbed by the electrostatic adsorption force. And the conductor wire above the electrostatic chuck 50 is connected to a direct current (DC) power source 54 through a wiring 52 to exert the electrostatic absorption force described above. Further, also on the wiring 52, is a high-frequency wave power source for bias 56 for applying a high-frequency wave for bias of, for example, 13.56 MHz, to the conductor wire of the electrostatic chuck 50. Inside the placing table 44, a heating unit 58 consisting of a resistive heater is provided to heat the wafer W as needed.

Further, onto the placing table 44 above, provided is a plurality of, for example three, elevation pins (not shown), for moving the wafer W up and down when moving it in and out. Also, the entire placing table 44 is formed from a heat resistant material for example ceramic, such as alumina. On the side wall of the process container 42, provided is a gate valve 48 for opening and closing when carrying the wafer W in and out, and an exhaust opening 62 is provided on the bottom section 60 of the container for exhausting the atmosphere in the container.

Further, onto the exhaust opening 62 above, an exhausting system 64 for exhausting, for example vacuum exhausting, the atmosphere in the process container 42. Specifically, the exhausting system 64 has an exhaust channel 66 connected to the exhaust opening 62. On the uppermost stream side of this exhaust channel 66, a pressure control valve 68 includes, for example, a gate valve, is located, and further, a first vacuum pump 70 consisting of, for example, a turbo molecular pump, and a second vacuum pump including, for example, a dry pump, are installed in series towards the downstream. And on the side wall of the process container 42, a pressure detector 74, including, for example, a capamanometer, and the pressure in the container measured at the pressure detector 74 is input to a control unit 114 described later, allowing feed back control of the pressure control valve 68.

The ceiling of the process container 42 includes an opening and onto this opening, a top plate 76 formed from a ceramic material, such as $Al_2O_3$, and quartz, and having permeability to microwaves is hermetically provided through a sealing member 78, such as an O-ring. The thickness of this top plate 76 is configured to, for example, about 20 mm considering the resistance to pressure.

And, onto the upper face of this top plate 76, a plasma generating unit 80 is provided for generating a plasma in the process container 42. Specifically, this plasma generating unit 80 has a disk-shape planar antenna member 82 provided on the top face of the top plate 76, and a slow wave structure 84 is provided on the planar antenna member 82. This slow-wave structure 84 has high permittivity characteristics to shorten the wavelength of the microwave. The planar antenna member 82 is configured as a bottom plate of a guide wave box 86 including a conductive hollow tubular container which covers the upper whole area of the slow-wave structure 84 above, and is positioned to face the placing table 44 in the process container 42 above.

The surrounding area of the wave guide box 86 and planar antenna member 82 is conductive to the process container 42, and an outer tube 88A of a coaxial wave guide tube 88 is connected to the upper center of the wave guide box 86. Inside of the outer tube 88A, an inner conductor 88B is provided, and the inner conductor 88B is connected to the center of the planar antenna member 82 through a through-hole of the slow-wave structure 84 above. The coaxial wave guide 88 is connected to a microwave generator 94 of, for example, 2.45 GHz having a matching (not shown) through a mode exchanger 90 and a waveguide tube 92 to transmit the microwave to the planar antenna member 82.

The planar antenna member 82 above is formed from, for example, a copper plate or an aluminum plate with its surface silver plated, and onto this disk-plate, a plurality of microwave radiation holes 96 made of long groove form-through holes are provided. This arrangement configuration of the microwave radiation hole 96 is not limited specifically, and it may be arranged, for example, concentrically, spirally or radially.

And, on the upper side of the placing table 44 above, a gas injection unit 98 for ejecting a gas, which is necessary for processing, into this process container 42, and a gas supply unit 100 is connected to the gas injection unit 98 for supplying the processing gas while controlling the flow rate. Specifically, the gas injection unit 98 includes a shower head made of quartz formed in, for example, a lattice shape, and a plurality of gas ejection holes 102 are formed in a midstream of the gas channel. The diameter of the gas ejection hole 102 is configured to, for example, 0.5 mm or below to evenly eject the gas into the process container 42, and the conductance is configured slightly low. In addition, at the shower head, there is a configuration that forms the entire of shower head into a box-shape container and forms a plurality of gas ejection holes on its lower face. The configuration of the shower head is not limited specifically.

Further, the gas supplying unit 100 above has a gas channel 104 which is connected to the gas injection unit 98 at its top end section. The rear end of this gas channel 104 is bifurcated into plural channels, in this case, three, and each of the bifurcated channels is connected to gas sources 104A, 104B, and 104C so that each gas can be supplied as needed. Here, in order to facilitate understanding of the present invention, etching gases A B and C that are different from each other are retained in each of the gas sources 104A to 104C respectively as the processing gases. In addition, actually, a supplying source for an inactive gas, such as N2 gas, is provided, however, it is omitted in the figure.

In the midstream of each of the bifurcation channels, a flow rate controller 106A, 106B and 106C is inserted for controlling the flow rate of the gas flowing in each of the channels, and an on-off valve 108A, 108B and 108C is inserted to the upper stream side and the lower stream side of each of the flow rate controllers 106A to 106C to flow each of the gases above as needed while controlling the flow rate. Here, as the flow rate controllers 106A to 106C above, it is preferable to use a flow control system that is capable of flowing a large amount of gas instantly according to the pressure difference of the upper and lower stream sides, as well as, accurately controlling a fine flow rate.

And, a bypass channel 110 for high rate exhaust, which is the characteristic of the present invention, is provided so as to communicate the gas channel 104 of the gas supplying unit 100 above and inside the process container above. In a midstream of the bypass channel 110 for high rate exhaust, an on-off valve 112 for high rate exhaust is inserted to communicate and to block the passage as needed.

In this way, the process gas (etching gas) remaining in the gas channel 104 can be exhausted into the process container 42 side in a high rate when needed. In such a case, a gas exit 110A in the process container 42 of the bypass channel 100 for high rate exhaust is located on the lower side of the horizontal level of the placing table 44 to avoid the etching gas exhausted into the process container 42 from direct exposure onto the wafer W on the placing table 44. Further, as to the bypass channel 110 for high-rate exhaust, though it depends on the pressure and so on in the process container 42, it is preferable to use a pipe that has as large inner diameter as possible, for example, a pipe with an inner diameter of 7 mm or more, to increase the conductance of the exhaust.

The operation of the entire plasma processing apparatus 40 is controlled by a control unit 114 which includes, for example a micro computer or the like. The program of the computer, which performs this operation is stored in a storage medium 116, such as a floppy disk, CD (Compact Disc), HDD (Hard Disk Drive), or flash memory. Specifically, by the command from the control unit 114, a supply of each process gases, flow control, supply of microwave or high-frequency wave or power control, on-off control of the on-off valve 112 for high-rate exhaust, or control of the process temperature or process pressure are performed.

Figure 7:
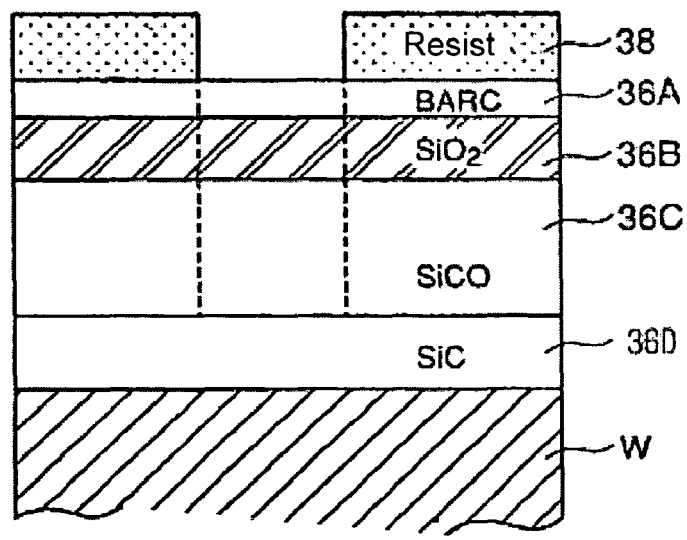
FIG. 7 is a cross-section diagram illustrating laminated films with different film types laminated on a semiconductor wafer.

Next, explained is a processing method using the plasma processing apparatus 40 configured as described above. Here, as a plasma process, a case of multi-step processing is explained as an example. In the multi-step process, etching gases A, B and C are switched and supplied as shown in FIG. 7, and an antireflective film 36A, SiO2 film 36B and SiCO film 36C in FIG. 7 are etched in series. As described above, each of the operations explained below, for example supply and exhaust of each gas or flow rate control, or control of the degree of the valve opening, is performed based on the program stored in the storage medium 116 above.

First, an example of a multi-step process is specifically explained. FIG. 7 is a cross-section diagram illustrating a laminated film that has different types of film laminated on a semiconductor wafer. And, as a multi-step process, a case in which an etching process is performed on the laminated film above while changing the etching gases, is explained as an example.

In FIG. 7, on the surface of a semiconductor wafer W, which is a processing subject, a SiC film 36D, SiCO film 36C, SiO2 film 36B, and antireflective film (BARC; Bottom Anti Reflective Coating) 36A are laminated in series, and a patterned resist film 38, which becomes a mask, is provided on the uppermost layer. Here, the multi-step process etching is performed to each of the films laminated as described above, except for the SiC film 36, according to the pattern of the resist film 38. In this way, trenches and holes are formed. At this time, in order to facilitate understanding, using different types of etching gas for each of the films, the antireflective film 36A is etched with an etching gas A, the SiO2 film 36B is etched with an etching gas B and the SiCO film 36C is etched with an etching gas C.

In order to perform this multi-step process, first, flow the etching gas A into the process container 42 and etch the antireflective film 36A, next, switch the gas type to the etching gas B and etch the SiO2 film 36B, and then switch the gas type to the etching gas C and etch the SiCO film 36C. The etching time for each of the films depends on the film thickness, however, the etching time for the antireflective film 36A is about 30 seconds, for the SiO2 film 36B is about 60 seconds, and for the SiCO film 36C is about 60 seconds. And, each time switching the gas type as described above, an exhaust process for the process gas in the precedent process and a stabilizing process for the pressure of the process gas in a subsequent process are performed.

Next, the specific processing method with the plasma processing apparatus 40 shown in FIG. 1 is hereinafter explained. First, the semiconductor wafer W is stored in the process container 42 with a transporting arm (not shown) through the gate valve 48, the wafer W is placed on the placing face located on the upper face of the placing table 44 by moving an elevation pin (not shown) up and down, and the wafer W is electrostatically absorbed by the electrostatic chuck 50.

In a case when a heating unit is provided, the wafer W is maintained to a predetermined process temperature, and a necessary gas, at this time an etching gas because an etching process is performed here, is supplied by flowing the etching gas in a predetermined flow rate from the gas supply unit 100 though gas channel 104 and ejecting the gas into the process container 42 from the gas ejection hole 102 of the gas injection unit 98 including the shower head. At the same time, the vacuum pumps 70 and 72 of the exhaust system 64 are driven to maintain the inside of the process container 42 at a predetermined process pressure by controlling the pressure control valve 68. Concurrently, the microwave generated by the microwave generator 94 is supplied to the planar antenna member 82 through the wave guide 92 and coaxial waveguide 88 by driving the microwave generator 94 of the plasma generating unit 80. Next, the microwave with the wave length shortened by the slow-wave structure 84 is introduced to the processing space S, and this generates a plasma in the process space S to perform an etching process using a predetermined plasma.

When the microwave is introduced to the process container 42 from the planar antenna member 82, each gas is plasmanized and activated by this microwave, thereby the etching treatment by the plasma is applied to the surface of the wafer W by the active species generated at this time. Further, during plasma processing, a high-frequency wave for bias is applied to a conductor line in the electrostatic chuck 50 from the high-frequency wave power 56 for bias, thereby, the active species and so on are attracted to the wafer surface with a favorable rectilinear property.

During the plasma processing described above, the atmosphere in the process container 42 is vacuumed by driving the vacuum pumps 70 and 72 of the exhaust system 64, thus the atmosphere in the process container 42 flows downwards around the surrounding section of the placing table 44 while diffusing from the process space S, and further flows to the exhaust system 64 side from the exhaust opening 62. And the pressure in the process container 42 is detected by a pressure detector 74, and the pressure control valve 68 is feed back controlled so as to maintain the desired process pressure.

The etching process performed as described above here is the fore-mentioned multi-step process, thus each of the films 36A to 36C shown in FIG. 7 is etched consecutively in order in the same container. In such a case, when each of the films to be etched is different, the etching gas to be used is switched from the etching gas A to the etching gas C and supplied. That is, each time one etching step process is completed, the microwave generator 94 is turned off to stop the plasma, and the etching gas that was supplied at the time is also stopped. Thereafter, the residual gas is exhausted from the process container 42 and gas channel 104. Next, supply an etching gas of a different gas type, namely, switch the etching gas to stabilize the pressure in the process container 42. After stabilizing, a plasma is generated by turning the microwave generator 94 back on, and the next etching step process is started.

And, when the process in a predetermined time is completed, repeat the operation above and the etching process is performed continuously. In this way, each of the etching gases A to C is switched in order. At this time, the inside of the process container 42 is vacuumed continuously as described above. When each of the etching step processes is performed, a prescribed flow rate (gas flow rate) for each of the etching gases A to C to be flown, process pressure, process time (etching time) and so on are prescribed and programmed.

Here, in a conventional processing method, more than a certain time is required until the etching gas is filled in the process container 42 and stabilized because the etching gas is to be flown in a constant amount that is prescribed in advance when starting each of the etching steps. Further, when the etching gas from the precedent etching process remains in the gas channel 104 of the gas supplying unit 100, it also requires more than a certain time to remove this residual gas which resulted in a decrease of throughput.

In the method pertaining to the present invention, however, initially a flow rate greater than the prescribed flow rate described above, for example the etching gas with a flow rate about three time the prescribed rate is supplied in a predetermined short time, such as, about 1 second. Thereafter, the flow rate is decreased immediately and the gas is flown in a prescribed flow rate. As a result, the pressure is stabilized quicker and the etching process can be started, thus the throughput can be increased.

Further, when removing the residual gas in the process container 42 right before flowing the etching gas described above, the etching gas from the precedent process remaining in the gas channel 104 is rapidly exhausted into the process container 42 through the bypass channel 110 for high-rate exhausting that has a higher exhaust conductance by opening the on-off valve 112 for high-rate exhausting for a short time. Meanwhile, in a case when the bypass channel 110 for high-rate exhausting is not provided, the residual gas in the gas channel 104 is passed into the process container 42 though the shower head. In such a case, because the exhaust conductance of the gas injection unit 98, which is the shower head, is small, it requires a relatively long time for the residual gas in the gas channel 104 to pass into the process container 42 through the shower head, thus the through-put is decreased. In response, in the present invention, the residual gas is rapidly exhausted by providing the bypass channel 110, thereby the throughput can be improved.

The condition for switching of the etching gas described above is explained in detail with reference to the FIGS. 2 to 5.

Figure 2:
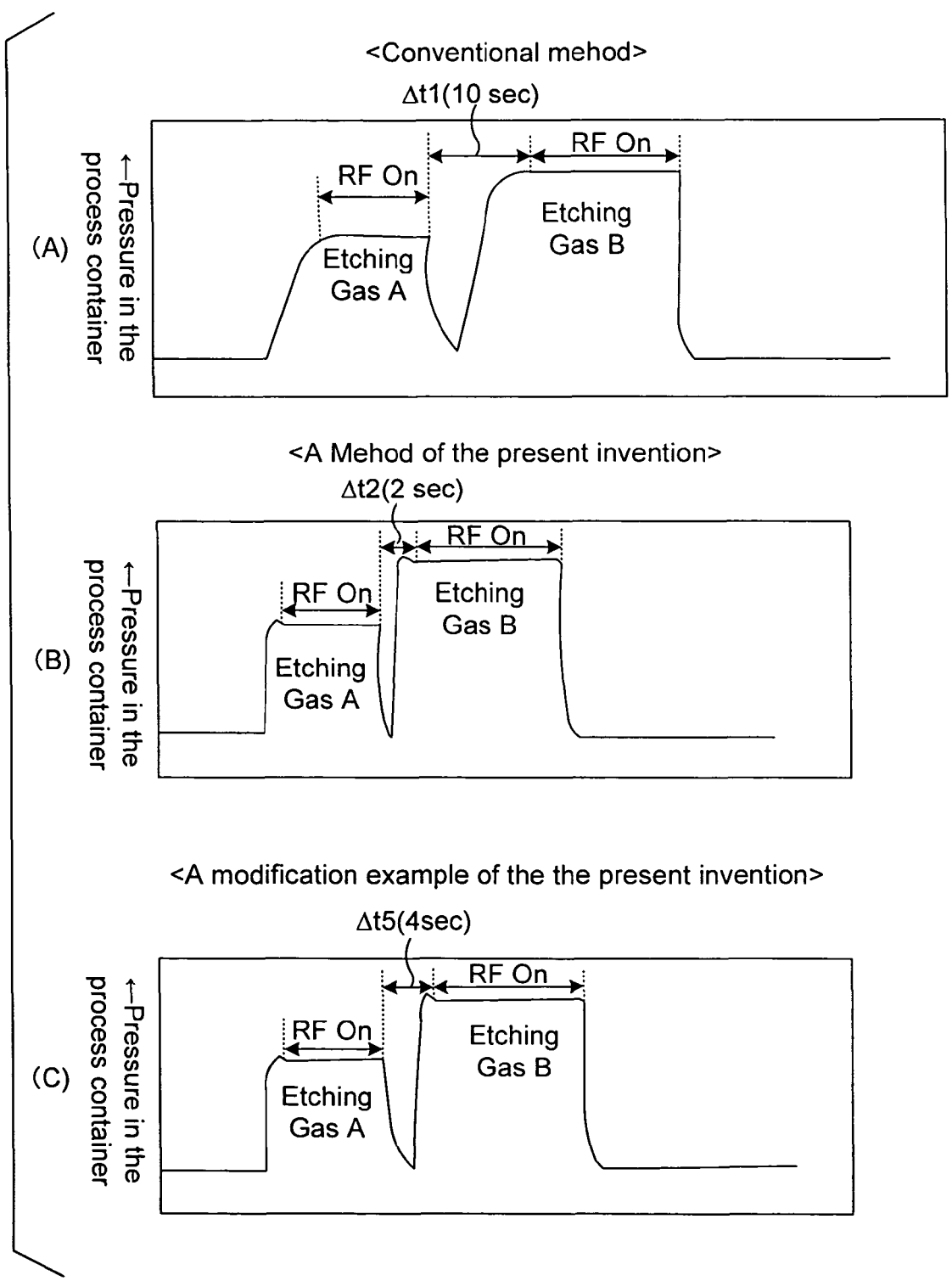
FIGS. 2 (A), (B) and (C) are diagrams illustrating changes in pressure inside a process container.
Figure 3:
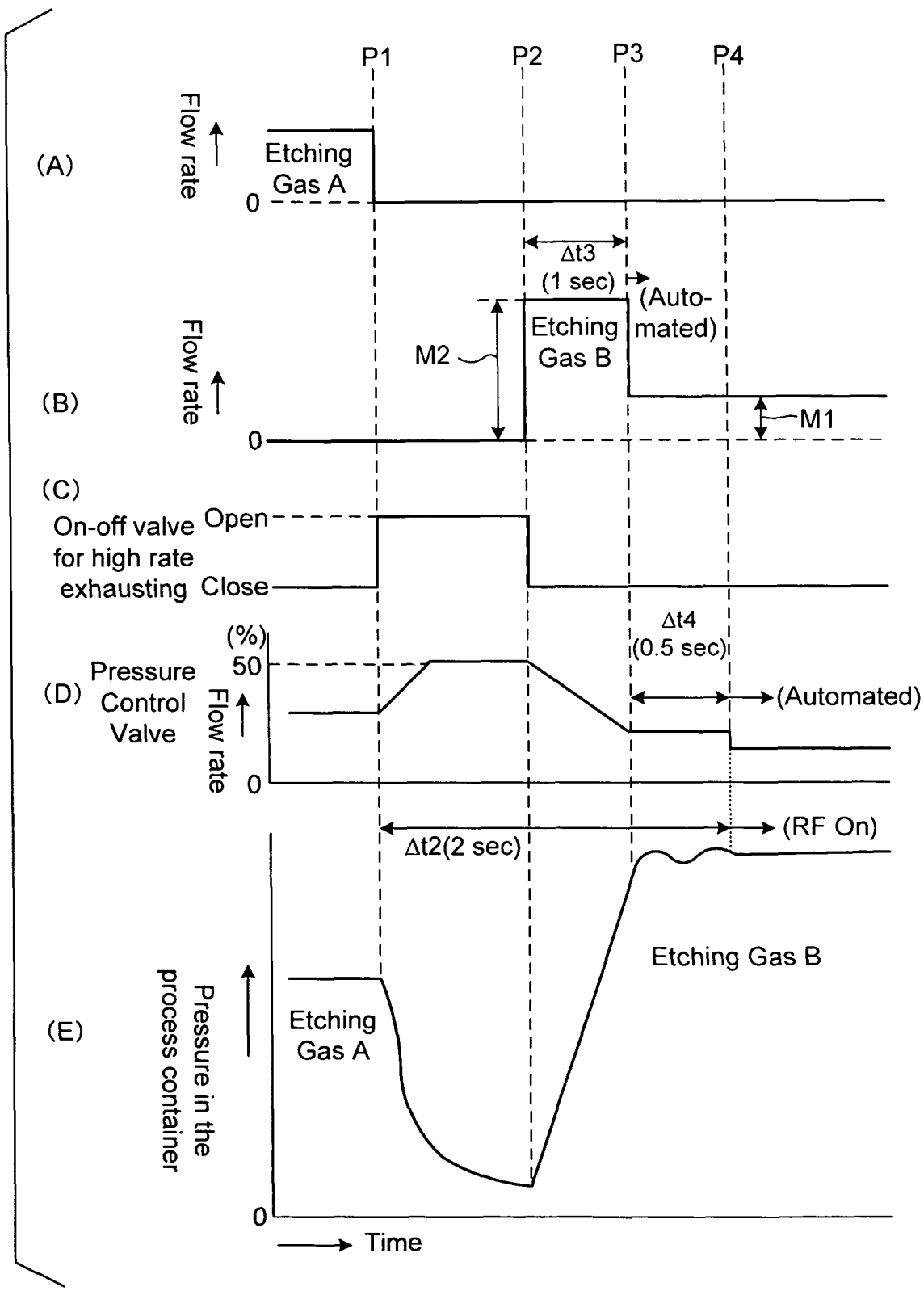
FIGS. 3 (A), (B), (C), (D) and (E) are diagrams illustrating an example of a timing chart for switching an etching gas, which is a processing gas.
Figure 4:
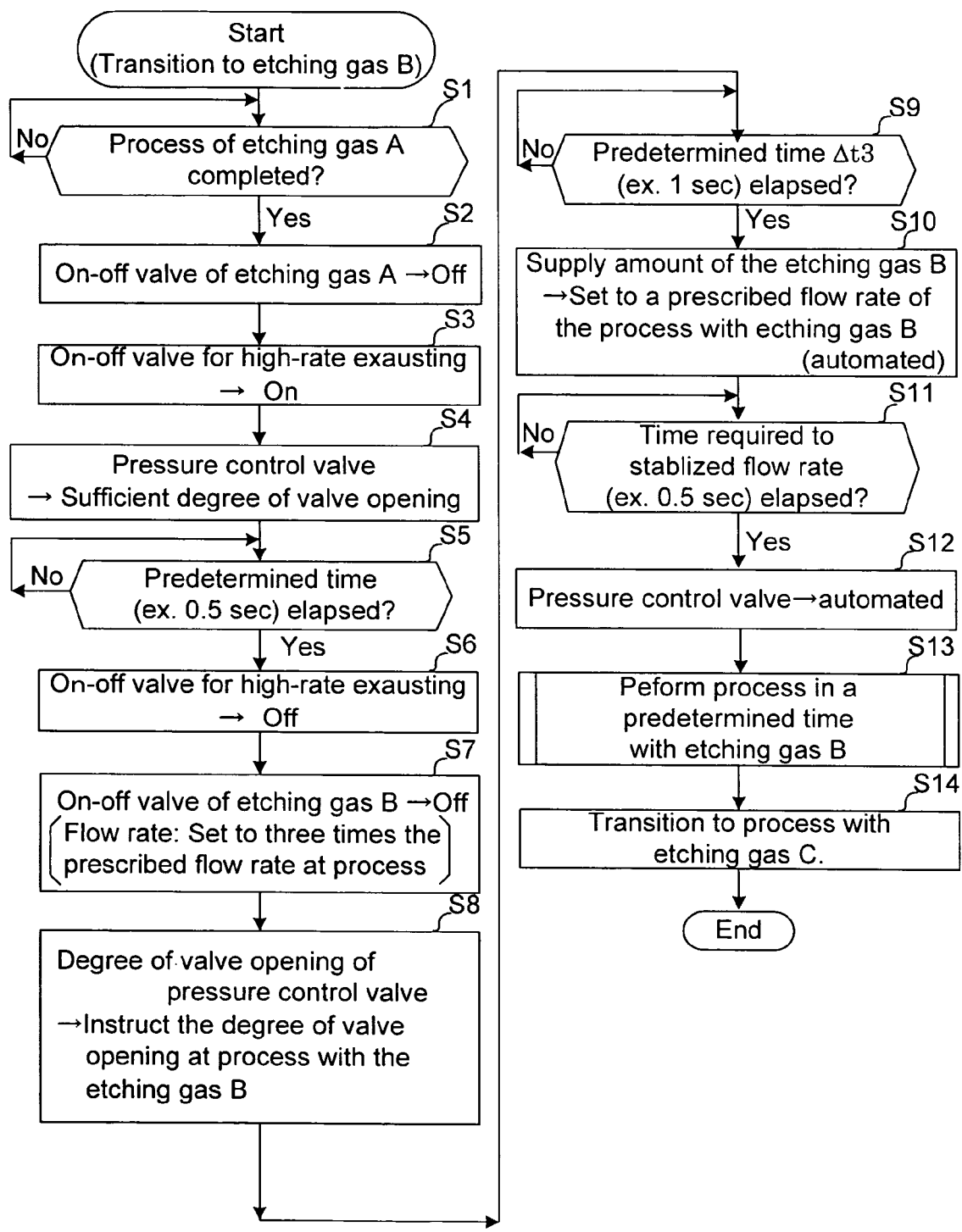
FIG. 4 is a flow chart showing each process of a method pertaining to the present invention.

FIG. 2 illustrates a change in the pressure in the process container, and FIG. 2(A) illustrates a case of the comparative example, and FIG. 2(B) illustrates a case of the method of the present invention. FIG. 3 illustrates an example of a timing chart when switching the etching gas, which is a processing gas, and illustrates a portion of FIG. 2(B) in an enlarged view. FIG. 4 is a flowchart illustrating each process of the method of the present invention. Here, the figure illustrates a case where the etching gas A is switched to the etching gas B as an example, and the switching from the etching gas B to the etching gas C is also performed in the same way.

In the figure, "RF On" indicates the period of time when the plasma is formed and the etching process is actually performed. Period between "RF On" is the period until the pressure in the process container 42 is stabilized after completing the precedent etching process and the etching gas is switched. As a result, the period $\Delta t1$ until the pressure stabilized is about 10 seconds in the case of the comparative example shown in FIG. 2(A), but the period $\Delta t2$ until the pressure stabilized is shortened to about 2 seconds in the case of the present invention shown in FIG. 2(A). Thus, it can be appreciated that the throughput can be substantially improved.

Next, the switching operation of the etching gases above is explained in detail with reference to the FIGS. 3 and 4.

In FIG. 3, FIG. 3(A) illustrates a change in the flow rate of the etching gas A, FIG. 3(B) illustrates a change in the flow rate of the etching gas B, FIG. 3(C) illustrates an on-off state of the on-off valve for high-rate exhausting, FIG. 3 (D) illustrates a degree of opening of the valve of the pressure control valve, and FIG. 3(E) illustrates the change in the pressure in the process container.

First, the etching gas process, which is the precedent process, is performed with the etching gas A and the etching gas A is flown in the prescribed flow rate, which was determined for this gas in advance. And, when the etching process with the etching gas A is completed at the time P1, (Yes at S1 in the FIG. 4), the on-off valve 108A of the gas channel that was supplying the etching gas A is closed, thereby the supply of etching gas A is stopped (S2). At the same time, the on-off valve 112 for high rate exhausting is opened (S3), and the pressure control valve 68 is configured to the sufficiently large degree of the valve opening (S4).

In this way, the residual gas in the process container 42 is rapidly exhausted, and the etching gas A remaining in the gas channel 104 of the gas supply unit 100 is exhausted into the process container 42, which is in a high vacuum state, through the bypass channel 100 for high-rate exhausting, that has a high exhaust conductance. At this time, because the exhaust conductance at a portion of the gas ejection hole 102 with a small diameter is small, the residual gas in the gas injection unit 98 including the shower head is flown back into the gas channel 104 above and further exhausted into the process container 42 through the bypass channel 110 for high-rate exhausting.

The residual gas in this process container 42 is immediately exhausted to the exhaust system 64 side. As a result, the residual gas (etching gas A) in the gas injection unit 98 including the shower head in the gas channel 104, or in the process container 42 is rapidly exhausted outside the system, thus the pressure in the process container 42 can be rapidly decreased as shown in FIG. 3(E). At this time, the degree of the opening of pressure control valve 68 is configured to 50%, which is the degree of opening larger than the normal pressure control range to sufficiently increase the exhaust conductance at this portion. When the degree of the opening of the pressure control valve 68 is in the range of 50 to 100%, the exhaust conductance is saturated and there is not much change. Further, when the degree of valve opening is configured to 100% and then the degree of opening is configured to about 20% for pressure control, it takes too long to operate the valve until reaching the degree of valve opening, thus the degree of valve opening is configured to 50%. The degree of valve opening referred here indicates the range that the exhaust gas is actually flown in the valve opening of the pressure control valve 68. And when the valve is opened halfway, the degree of valve opening is 50% and when the valve is opened entirely, the degree of valve opening is 100%.

In this way, when a predetermined time, for example about 0.5 seconds, is elapsed (Yes in S5), the on-off valve 112 for high-rate exhausting is switched to the off state at time P2 (S6), and the on-off valve 108B for etching gas B is switched to the on state for subsequent processes to start the supply of the etching gas B (S7). At this time, the flow rate of this etching gas B is not the prescribed flow rate predetermined for this process, the flow rate controller 106B is configured to a larger amount than the prescribed flow rate, for example, M2 which is three times the prescribed flow-rate M1 above, and then the etching gas B is begun to flow at this large flow rate.

At the same time, the pressure control valve 68 is instructed to open to the valve opening that corresponds to the pressure set to the process of this etching gas B (S8). In such a case, because the setting pressure is predetermined, the degree of valve opening corresponding to the pressure is virtually determined, thus the pressure control valve 68 is instructed to operate to this degree of valve opening. In addition, for the degree of valve opening at the process, the pressure control is normally performed in a range of 5 to 20%.

As shown in FIG. 3(E), the pressure in the process container 42 is far more rapidly increased by this operation compared to the method of the comparative example (refer to the FIGS. 2(A) and (B)).

When the etching gas B is supplied at a large flow rate in a predetermined short time $\Delta t3$, for example only one second, in this way (Yes in S9), the flow rate of the etching gas B is configured to the prescribed flow rate M1 for this process at the time P3, and the flow rate controller 106B is switched to an automated operation by the feedback control while in this condition (S10).

Here, the size of the flow rate M2 at the supply of the etching gas B above in the large flow rate is determined by the capacity V of the process container 42, the process pressure P of the etching process using this etching gas B and the time T necessary for increasing the pressure in the process container 42 to the process pressure above. For example, when the volume V in the process container 42 is 40 liters and the process pressure P is 1 Pa, the amount Vo1 of the etching gas B necessary is summarized by the following formula:

$$Vo1 = V \cdot 10^3 \times P \cdot 10^{-5} = 40 \times 10^3 \times 1 \times 10^{-5} = 0.4 \text{ cubic centimeters}$$

Thus, when the time T necessary for increasing the pressure in the process container 42 to the process pressure is 1 second, it is only necessary to flow the etching gas B in the large flow rate M2 indicated in the following formula.

$$M2 = 0.4 \times 60 \text{ (sec) } 24 \text{ sccm}$$

In addition, these numeric values merely showing an example, and needless to say are not limiting.

As discussed above, when an amount of the etching gas B at the time P3 is configured to the prescribed flow rate M1, the pressure in the process container 42 is slightly changed thereafter. And, when the time $\Delta t4$ necessary to stabilize the pressure, for example about 0.5 seconds, is elapsed (Yes in S11), the pressure in the process container 42 is assumed to be stabilized at the time P4, the pressure control valve 68 is switched to an automatic operation (S12) by the feedback control and the predetermined etching process with the etching gas B for forming the plasma is performed for a predetermined time (S13).

Subsequently, if the etching process with the etching gas B is completed, the process is transitioned to the process with the etching gas C by performing the same procedure described above (S14).

As described above, in the method of the present invention, at first the etching gas is supplied in an amount greater than the prescribed flow rate, for example three times the prescribed flow rate, for a predetermined short time, such as about one second, when starting each of the etching step processes. Thereafter, the flow rate is decreased immediately and the gas is flown in the prescribed flow rate. As a result, the pressure can be in a stabilized state quickly so that the etching process can be started, thus throughput can be improved.

Further, when the residual gas in the process container 42 is removed right before flowing the etching gas above, the etching gas from a precedent process remaining in the gas channel 104 is rapidly exhausted into the process container 42 through the bypass channel 110 for high-rate exhausting, which has a high exhaust conductance, by opening the on-off valve 112 for high rate exhausting for a short time. In a case when the bypass channel 110 for high-rate exhausting is not provided, the residual gas in the gas channel 104 is flown to the process container 42 through the shower head. However, since the exhaust conductance of the gas injection unit 98, which includes the shower head, is small, it takes a relatively long time for the residual gas in the gas channel above to flow into the process container 42 through the shower head, thus the throughput decreases. On the contrary, in the present invention, the residual gas is rapidly exhausted by providing the bypass channel 110 for high-rate exhausting, thus the throughput can be improved.

In addition, in the above embodiment, the gas exit 110A on the lower stream side of the bypass channel 110 for high rate exhausting is provided to face inside the process container 42, and it is not limited to this. It may be such that the downstream side of this bypass channel 110 for high-rate exhausting is connected to the exhaust channel 66 side of the exhaust system 64 to exhaust the residual gas in the gas channel 104 and so on directly to the exhaust system 64 side (refer to dashed-two dotted line in the FIG. 1). However, because the volume as a container to exhaust the etching gas remaining in the gas channel 104 is larger in the process container 42 than the exhaust channel 66 so that the increase in pressure in the container can be suppressed too low in the process container 42, thus, collectively, it is preferable to position the gas exit 110A so that it is facing the process container 42.

Further, in the embodiment above, the residual gas in the gas channel 104 or shower head in the gas supply unit 100 is rapidly vacuum exhausted to the process container 42 side by providing the bypass channel 110 for high-rate exhausting, this bypass channel 110 for high-rate exhausting may not be provided. In such a case, it takes a certain time to exhaust the residual gas compared to the case shown in FIG. 2(B) because etching gas is merely flown in a high flow rate for the predetermined short time Δt3 at the time of starting the supply of a new process gas (etching gas) and the residual gas in the gas channel 104 or the showerhead is not vacuum exhausted. Even so, the residual gas can be exhausted in a shorter time compared to the method of the comparative example shown in FIG. 2(A).

In other words, because of no process for forcibly removing the residual gas shown in FIG. 3(C), the time to exhaust the residual gas, that is, the time between the time P1-P2 increases; however, even so, the time required to switch the gases may be shortened compared to the method of comparative example shown in FIG. 2(A). At this time, the change in pressure in the process container 42 is shown in FIG. 2(C), and the time Δt5 until stabilizing the process gas is a little longer than the time Δt2 shown in FIG. 2(B). However, it is shortened from the time Δt1 of the method of the comparative example shown in FIG. 2(A) to for example, about 4 seconds, thus the overall throughput can be improved.

In the embodiment 1, the plasma etching process using the plasma is explained as an example of the predetermined process, but it is not limited to this. And the process may be applied to all of the processes, such as plasma CVD process, plasma ALD (Atomic Layered Deposition) forming process, plasma sputtering process, and plasma reforming process. And it is especially effective to a multi-step process in which gas species are switched and supplied.

Figure 5:
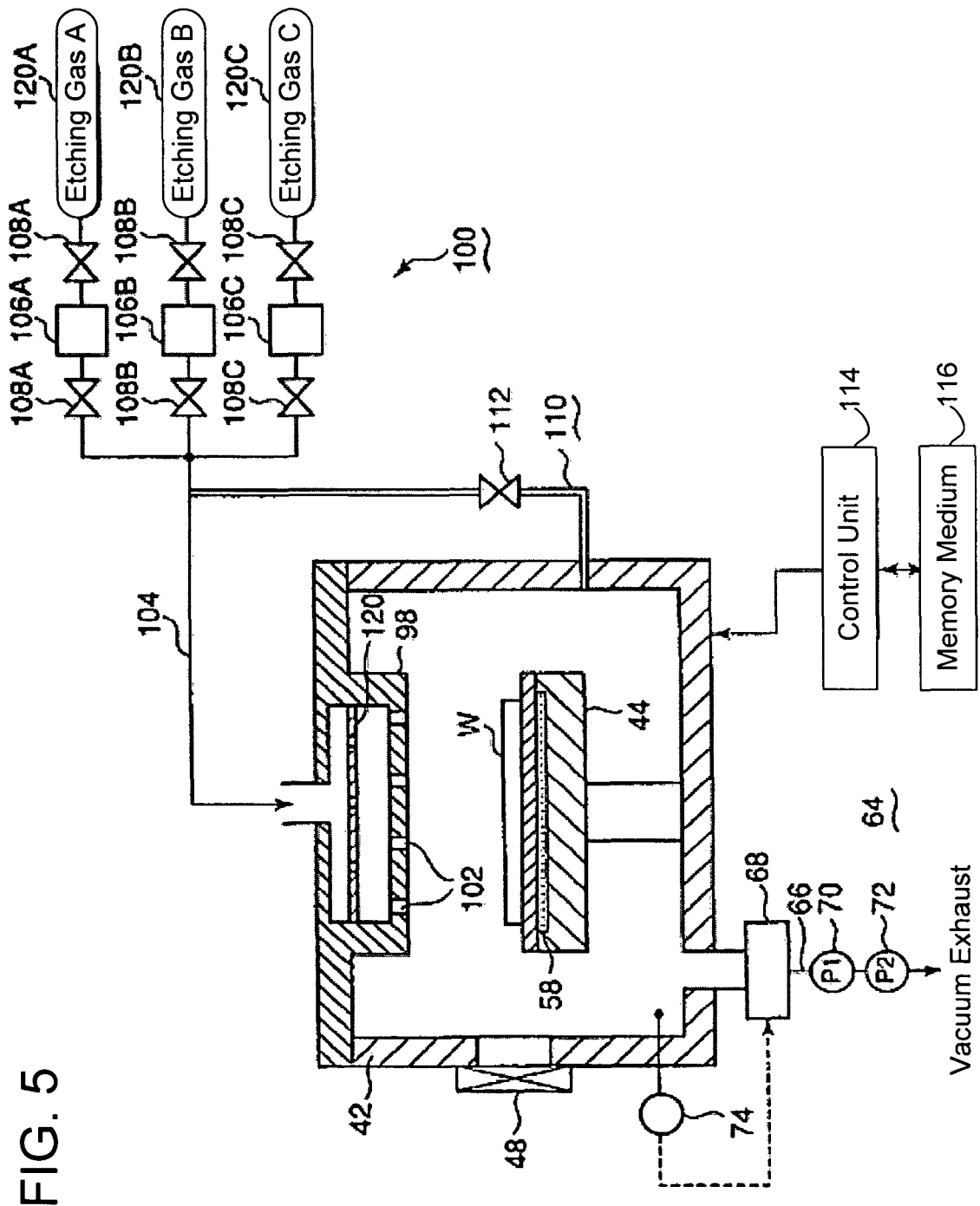
FIG. 5 is a cross-section diagram illustrating a modification example of a processing apparatus pertaining to the present invention.
Figure 6:
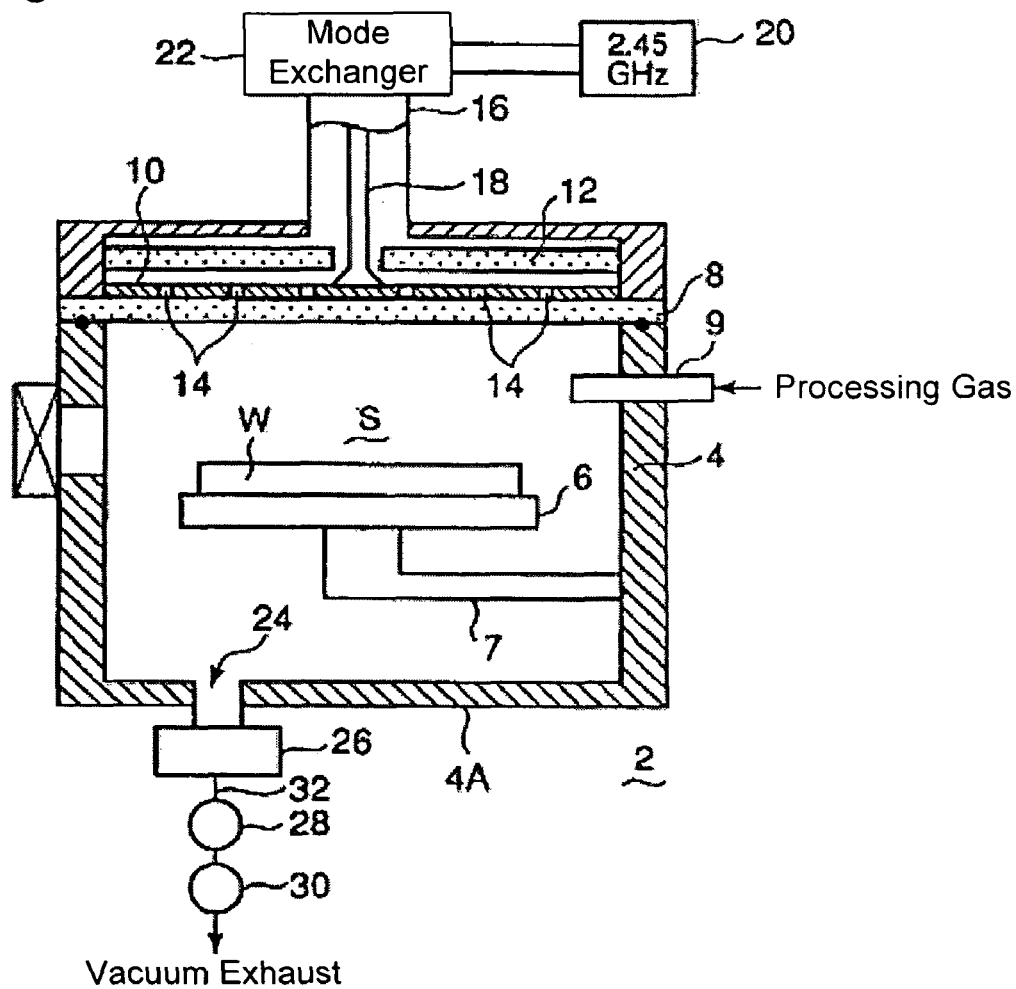
FIG. 6 is an outline configuration diagram illustrating a conventional common plasma processing apparatus.

Further, the present invention may be applied to all processes that do not use plasma, such as thermal CVD process, ALD forming process, oxidation diffusion process, and reforming process. And it is especially effective for a process in which gas species are switched and supplied, such as the ALD process. For example, FIG. 5 is a cross-sectional diagram illustrating a modification example of the processing apparatus of the present invention, and is a case where the present invention is applied to a heat treatment device. In addition, the same reference numbers are used for the configuration identical to that of the configuration shown in FIG. 1.

This heat treatment device performs the ALD forming process for forming a thin film layer by layer while repeating the thermal CVD process of switching of the forming gas.

Here, a heating unit 58 including a resistive heater for heating a wafer is located in the placing table 44, and the gas injection unit 98 is formed from a shower head in a box-shaped container form, and a diffusion plate 120 is provided inside. In addition, a heating lamp may be used as the heating unit 58 above to heat the pacing table 44, which is formed in a thin disc shape, from below.

As an example of the gas supplying unit 100, three gas sources 120A, 120B and 120C to retain three types of film forming gases A, B and C are provided and these film forming gases A, B and C are switched and supplied. And, between the gas channel 104 and process container 42 are also communicated by the bypass channel 110 for high-rate exhausting which has the on-off valve 112 for high-rate exhausting located midstream. In such a case, an effect similar to that of the embodiment described above can also be exerted.

Further, the semiconductor wafer is explained herein as an example of the processing object, but it is not limited to this. And the present invention may be applied to glass substrates, LCD substrates, ceramic substrates and so on.

What is claimed is:

1. A processing apparatus for performing a predetermined process using a process gas at a prescribed flow rate to an object, the processing apparatus comprising;
   a process container comprising a placing table for placing the object;
   an exhaust system having a vacuum pump and a pressure control valve for exhausting an atmosphere in the process container;
   a gas injection unit having a gas ejection hole for ejecting the process gas into the process container;
   a gas supplying unit for supplying the process gas to the gas injection unit while controlling the prescribed flow rate; and
   a control unit configured for controlling the entire processing apparatus;
   wherein the control unit controls the exhaust system and the gas supplying unit so that the process gas flows at a flow rate greater than the prescribed flow rate of the predetermined process, and the process gas is supplied for a predetermined short time at a constant flow rate while exhausting the atmosphere in the process container by the exhaust system; and
   thereafter the same process gas is supplied at the prescribed flow rate.

2. The processing apparatus according to claim 1, wherein the control unit controlling the exhaust system and the gas supplying unit to supply the process gas greater than the prescribed flow rate for a predetermined short time, which is determined based on a volume of the process container, a process pressure in the process container at the time of the predetermined process, and a time required to increase the pressure in the process container to the process pressure.

3. The processing apparatus according to claim 1, wherein the control unit controlling the exhausting system and gas supplying unit supplies a process gas within three seconds in a flow rate greater than a prescribed flow rate.

4. The processing apparatus according to claim 1, wherein the control unit controlling the exhaust system and the gas supply unit to supply the process gas at the flow rate greater than the prescribed flow rate, and controlling the pressure control valve to correspond to a process pressure in the process container.

5. The processing apparatus according to claim 1, wherein the gas supplying unit supplies a plurality of types of processing gases which are selectively supplied by switching.

6. The processing apparatus according to claim 5, wherein the gas supplying unit comprises a gas channel connected to the gas injection unit; and a bypass channel which includes an on-off valve for a high rate exhaust, which is located between the gas channel and the process container.

7. The processing apparatus according to claim 5, wherein the gas supply unit further comprises a gas channel connected to the gas injection unit; and a bypass channel having an on-off valve for a high-rate exhaust which is located between the gas channel and the exhaust system.

8. The processing apparatus according to claim 7 wherein, the control unit opens the on-off valve for the high-rate exhaust to exhaust the process gas from a precedent process remaining in the gas channel right before flowing the process gas at the flow rate greater than the prescribed flow rate for a predetermined short time.

9. The processing apparatus according to claim 1, wherein the gas injection unit comprises a shower head having a plurality of gas ejection holes.

10. The processing apparatus according to claim 1 comprising a heating unit for heating the object.

11. The processing apparatus according to claim 1, wherein the process container comprises a plasma generating unit for generating a plasma.

\* \* \* \* \*